United States Patent [19]

Deubzer et al.

[11] Patent Number: 4,781,319

[45] Date of Patent: Nov. 1, 1988

[54] BONDING HEAD

[75] Inventors: Werner Deubzer; Farhad Farassat, both of Les Brenets, Switzerland

[73] Assignee: Dynapert Delvotec S.A., Switzerland

[21] Appl. No.: 869,091

[22] Filed: May 30, 1986

[30] Foreign Application Priority Data

May 31, 1985 [DE] Fed. Rep. of Germany ....... 3519594
May 16, 1986 [GB] United Kingdom ................. 8612001

[51] Int. Cl.$^4$ ............................................. B23K 37/00
[52] U.S. Cl. ........................................ 228/4.5; 228/1.1
[58] Field of Search .................................. 228/4.5, 1.1

[56] References Cited

U.S. PATENT DOCUMENTS

| | | | |
|---|---|---|---|
| 3,342,972 | 9/1967 | Penberg | 228/4.5 X |
| 3,643,321 | 2/1972 | Field et al. | 228/4.5 X |
| 3,734,386 | 5/1973 | Hazel | 228/1.1 X |
| 4,053,096 | 10/1977 | Heim | 228/4.5 |
| 4,069,961 | 1/1978 | Nicklaus et al. | 228/4.5 X |
| 4,202,482 | 5/1980 | Sade et al. | 228/4.5 |
| 4,205,773 | 6/1980 | Nicklaus | 228/4.5 |
| 4,437,603 | 3/1984 | Kobayashi et al. | 228/4.5 |
| 4,550,871 | 11/1985 | Chan et al. | 228/4.5 |
| 4,576,322 | 3/1986 | Figueredo | 228/4.5 |

Primary Examiner—Nicholas P. Godici
Assistant Examiner—Carmine Cuda
Attorney, Agent, or Firm—Andrus, Sceales, Starke & Sawall

[57] ABSTRACT

A bonding head (10) of a wire bonding machine for bonding wire to electronic or electronical components comprises a bonding tool (18) connected to an ultrasonic transducer (16), a wire spool (22) mounted at the opposite side of the head to the transducer (16), and (optionally) a guide (60) including a tubular member (62) adjustably mounted on the head (10) having an inlet end through which wire (20) from the spool (22) passes and an outlet end (64) adjacent the bonding tip (19), the guide (60) being mounted for angular movement on an arm (70) itself pivotally mounted whereby the angle of the guide (60) can be adjusted while maintaining the outlet end (64) in position adjacent the bonding tip (19). Thus the wire (20) can be supplied to the tool (18) at a variety of different angles according to the component to which the wire is to be bonded.

13 Claims, 4 Drawing Sheets

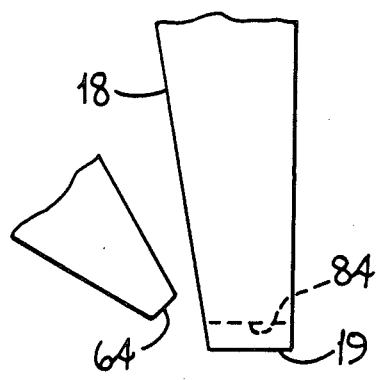 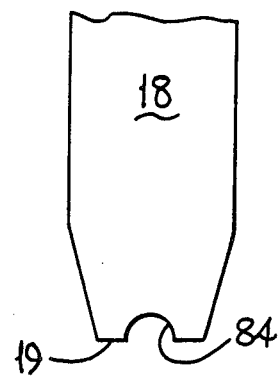
FIG. 2  FIG. 3
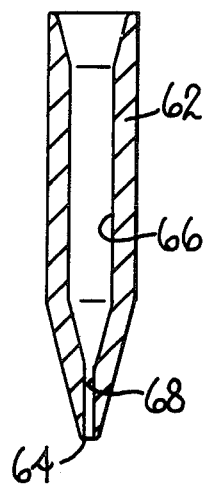 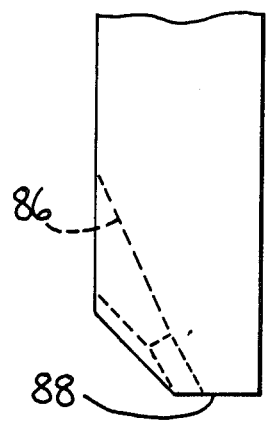
FIG. 4  FIG. 5
PRIOR ART

BONDING HEAD

BACKGROUND OF THE INVENTION

This invention is concerned with a bonding head for a wire bonding machine for bonding wire to a contact surface of an electronic or electrical component, for example a so-called chip, and is especially concerned with such a machine for ultrasonic bonding.

Such machines are known, see for example German patent application No. P 33 43 738, and comprise a bonding head comprising a bonding tool mounted on an ultrasonic transducer, a bonding tip of the tool being arranged, in the operation of the machine, to press electrically conducting wire against the contact surface of an electrical or electronic component, the wire being drawn from a suitable wire supply, for example a spool; the machine may also include a wire clamp by which the wire drawn from the spool may be clamped, the wire clamp being movable backward and forward generally in the direction in which the wire is fed to appropriately position the free end of wire drawn from the spool after completion of a bonding operation. In many previously known machines the wire spool has been mounted above the transducer in the bonding head and the wire drawn from the spool has passed through a hole in the transducer and in a part of the bonding tool to reach a position between the bonding tip and the contact surface. This arrangement has not been altogether satisfactory.

Any change of the basic setting of the transducer and/or of the inclination of the wedge relative to the bonding pad on the electric or electronic component is practically impossible with the structure as proposed, because wire feeding occurs through the transducer. In that case the transducer and the wire spool would have to be adjusted in accordance with the changed inclination of the wedge, whereby the overall structure would become considerably more expensive. Also, with the proposed structure it is only possible to mount relatively small-sized wire spools in the bonding head, because there is only little space available for the wire spool above the bonding head. Practically no space is left for a wire tension sensor.

SUMMARY OF THE INVENTION

It is the object of the instant invention to provide a bonding head which is distinguished over the previously proposed solution by a considerably less compact structure, wherein especially also the inclination of the transducer and/or of the wedge relative to the transducer can be readily varied, and which particularly provides for the mounting of larger-sized wire spools, especially thickwire ($\geq 100$ $\mu$m) spools.

This object is solved in a surprisingly simple way by the feature that relative to the wedge the wire spool is adapted to be mounted on the side of the bonding head opposite the transducer, thereby the overall structure becomes less compact. Transducer and wedge may be varied as to the basic setting and inclination irrespective of the wire feed. Above all, the structure according to the invention is suitable for rotary bonding heads, in which conventional microscopic observation is not provided in any case. With a stationary bonding head, microscopic observation will have to be effected either obliquely from in front or from the side. This also can be effected relatively easily.

With the structure according to the invention it is also readily possible to provide a wire tension sensor between the wire spool and wire clamping means or wedge for controlling the spool drive.

Within the region where the wire spool is disposed according to the invention there will be sufficient space for larger-sized wire spools, e.g. wire spools having an outer diameter of from 50 to 70 mm and a length of 25 mm and more. The arrangement of such wire spools on top of the transducer is not possible with the normally highly compact structure of a bonding head. In particular, the use of such large-sized wire spools is impossible due to the fact that the wire is fed through the transducer. This kind of wire feed does not permit any major sideways movement of the wire.

Also of particular constructional interest are the wire guide means associated with the wire spool, either in the form of funnel or in the form af a small guide tube centrally passing through the wire spool and having its wire exiting end directed towards the wedge.

As mentioned above the need for the wire to pass through a hole in the transducer is eliminated but normally the wire is still to be guided to the bonding tip by passing through a small hole in a lower part of the bonding tool. It has not, therefore, been possible readily and simply to alter the angle at which the wire is supplied to the bonding tip.

Therefore, it is further proposed to adjustably mount the wire quide in the bonding head, the guide having an inlet end through which wire from the spool passes and an outlet end disposed adjacent the said bonding tip of the bonding tool. The guide is mounted in such a manner that the angle at which the wire is supplied to the bonding tip can be adjusted.

Using a bonding head according to the invention it is therefore possible to supply the wire to the bonding tip of the tool without the need to cause the wire to pass through a guide hole in the bonding tool. By adjusting the position of the guide it is therefore possible to change the angle at which the wire is presented to the bonding tip.

In a preferred bonding head according to the invention the bonding tip is provided with a slight groove which constrains the wire against sideways movement during the bonding operation.

It is, of course, possible, where necessary in a bonding head in accordance with the invention, to provide a wire feeding system by which the wire is positively fed from a spool, for example by rotating the wire spool: where a wire feed system is provided the above mentioned wire tension sensor may conveniently be disposed between the wire spool and the wire clamp by which the speed of the wire feeding system can be controlled. However, it has been found that a wire feeding system is not essential for many types of wire.

As the wire is not fed through the transducer or the bonding tool itself, wire of larger diameter than previously used, for example up to about 12 mil (about o, 3 mm) in diameter, may be used.

BRIEF DESCRIPTION OF THE DRAWINGS

There now follows a detailed description, to be read with reference to the accompanying drawings, of a bonding head for a wire bonding machine embodyng the invention. It will be realized that this head has been selected for description to illustrate the invention by way of example: In the accompanying drawings:

FIG. 2 is a view in side elevation showing a bonding tip of a bonding tool of the head;

FIG. 3 is a view in front elevation of the bonding tip of the bonding tool;

FIG. 4 is a view in section of a guide of the bonding head;

FIG. 5 is a view in side elevation of a bonding tip of a bonding tool of the prior art;

DESCRIPTION OF ILLUSTRATED EMBODIMENTS

Figure 1:
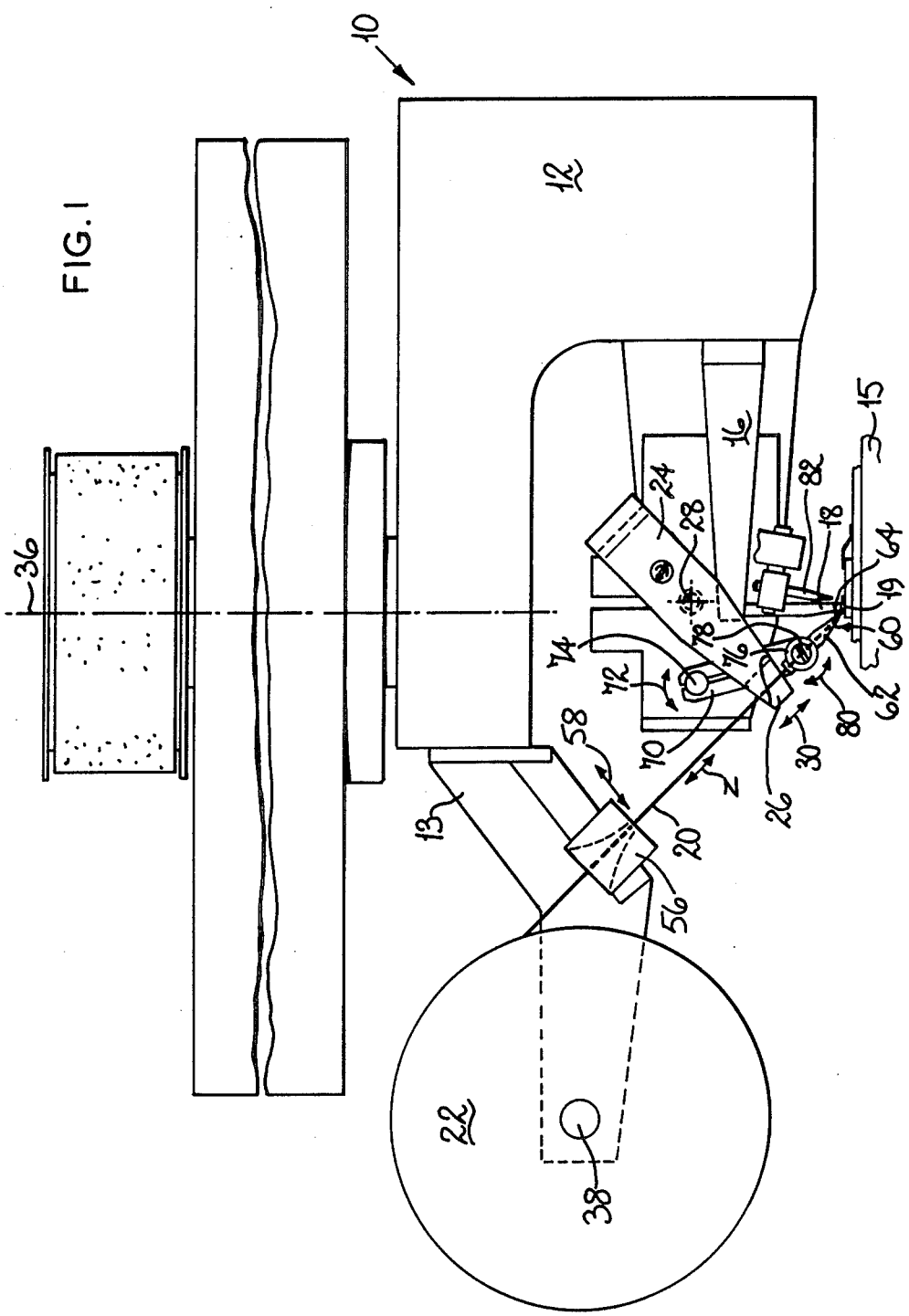
FIG. 1 is a diagrammatic view in side elevation of a first embodiment of a wire bonding machine, with parts broken away, showing a bonding head embodying the invention.

In FIG. 1 is shown a wire bonding machine embodying the invention for bonding wire to a contact surface of an electronic or electrical component, for example a chip. The illustrative machine comprises a bonding head 10 mounted for rotation about an axis 36, and comprising a frame 12. Electrical components to which wire is to be bonded are supported on a support 15. Means (not shown) is provided for adjusting the relative positions of the frame 12 and support 15 so that a bonding tip 19 of a bonding tool 18 may be aligned with sites on the component to which wire is to be bonded and so that the bonding tip 19 may be pressed against the site on the component to effect a bond in the operation of the machine. Conveniently the bonding head 10 is mounted on a member of an X-Y table so that the position of the axis 36 can be adjusted relative to a component mounted on the support 15 and the support 15 is mounted for movement in a direction parallel with the axis 36 to move a component carried by the support 15 towards and away from the bonding tip 19.

The bonding tip 19 is arranged to lie on the axis 36 at right angles to a plane providing a support surface of the support 15, on which surface the components to which wires are to be bonded are supported.

The bonding head 10 comprises transducer means 16, a portion of which remote from the axis 36 is mounted on the frame 12 of the bonding head 10. The bonding tool 18 is mounted on the transducer means 16 so that the bonding tip 19 lies substantially on the axis 36. A spool 22 of wire 20 is mounted for rotation on a bracket 13 of the frame 12. Also mounted on the bracket 13 is a guide collar 56. The position of the guide collar can be adjusted in the direction of the arrows 58 on the bracket 13 according to the angle at which it is wished to feed the wire 20 to the bonding tip 19 of the tool 18. Although the machine shown includes the guide collar 56 the collar 56 merely provides an auxiliary guide for the wire 20 and may be omitted if the spool 22 is not power-driven to feed wire from the spool 22. Where the spool 22 is power-driven a suitable sensor (not shown in FIG. 1) will be included in the machine to sense the tension in the wire 20 and control the drive for the spool 22 accordingly.

A guide 60 for the wire 20 is adjustably mounted on the frame 12 and comprises a tubular member 62 (or capillary) through which the wire 20 is fed to the bonding tip 19. The member 62 has a passage 66 (see FIG. 4) extending therethrough, through which wire 20 from the spool 22 passes from an inlet end of the member 62; the majority of the passage 66 is of considerably larger diameter than the maximum diameter of wire for which the tubular member 62 is suitable. An outlet end portion 68 of the passage 66 which opens to an outlet end 64 of the tubular member 62 is of reduced diameter, only slightly greater than the diameter of the largest wire (for example up to about 0,3 mm in diameter) intended to be used with the particular member 62. Thus the angle at which the wire 20 emerges from the member 62 is dictated by the angle of the outlet end portion 68 of the passage in relation to the axis 36.

An arm 70 is mounted for rotational movement, as indicated by arrows 72, about a pivot 74, secured to a member of the frame 12. The arm can be clamped at any angular position to which it has been adjusted about the pivot 74 by a screw (not shown). At an outer end portion of the arm remote from the pivot 74 an axle of a clamping bush 76 is mounted for rotation. The tubular member 62 is slidingly received in a passage extending through the clamping bush 76 perpendicularly to the rotational axis of the axle of the bush. A screw 78 clamps the tubular member 62 in position in the bush 76 and a screw (not shown) clamps the axle of the bush 76 in the arm 70. By releasing the screw clamping the axle of the bush 76 in the arm 70 and the screw clamping the arm 70 to the pivot 74 and, additionally, releasing the screw 78 so that the member 62 can be slid in the passage of the bush 76, the arm 70 and bush 76 may be rotated as indicated by the arrows 72, 80. The inclination of the member 62 relative to the axis 36 may thus be adjusted so that the wire passing through the member 62 is presented to the bonding tip 19 at a desired angle and, whilst making the rotational adjustments, the member 62 itself is slid in the passageway in the bush 76 so that the outlet end 64 is maintained adjacent the bonding tip 19. When the guide member 62 has been adjusted to a desired position the various clamping screws are rotated to lock the arm 70, bush 76 and guide member 62 in the adjusted position.

A wire clamp 24 is mounted on a protion of the frame 12 for pivotal movement about an axis 28 (see double-arrow 30) to make slight movements of the wire during the wire bonding operation as is conventional in wire bonding. The wire clamp 24 is mounted with jaws 26 of the clamp 24 just above the inlet end of the member 62. The jaws 26 have a clamping area more extensive than is common (indicated by the dashed line in the drawing) so that the wire 20 may still be clamped by the jaws 26 throughout the whole range of angular adjustment of which the guide 60 is capable (see also FIG. 6).

A knife 82 is mounted adjacent the bonding tool 18 at the opposite side of the tool to the guide 60 to sever the wire at an appropriate position after a bonding operation. The knife 82 is operated by a solenoid (not shown) in a manner previously known in wire bonding machines. Use of the knife 82 to sever the wire after bonding is necessary where a thick wire is used; however, where the machine is operated to effect a wire bonding operation using thin wire the wire may be broken after a bonding operation by pulling it by means of the wire clamp 24 (again as well known in wire bonding machines).

As can be seen from FIGS. 2 and 3 of the accompanying drawings the bonding tip 19 has a shallow groove 84 which is effective to prevent wire escaping sideways, during bonding, from beneath the bonding tip 19 in the operation of the machine. The lower portion of the bonding tool 18 and the outlet end 64 of the tubular member 62 are tapered so that the outlet end 64 can be positioned very closely adjacent the tip 19.

FIG. 5 is a view of the lower end portion of a bonding tool as for example used in a machine as described in connection with FIG. 6. As can be seen a guide passage 86 is provided in the lower end portion of the tool so that the angle at which the wire is presented to the bonding surface 88 of the tool is fixed. As has been described previously the angle of the wire presented to the bonding tip 19 of the tool 18 by the adjustable guide 60 can be adjusted over a considerable range according to the bonding operation which is to be carried out.

Figure 6:
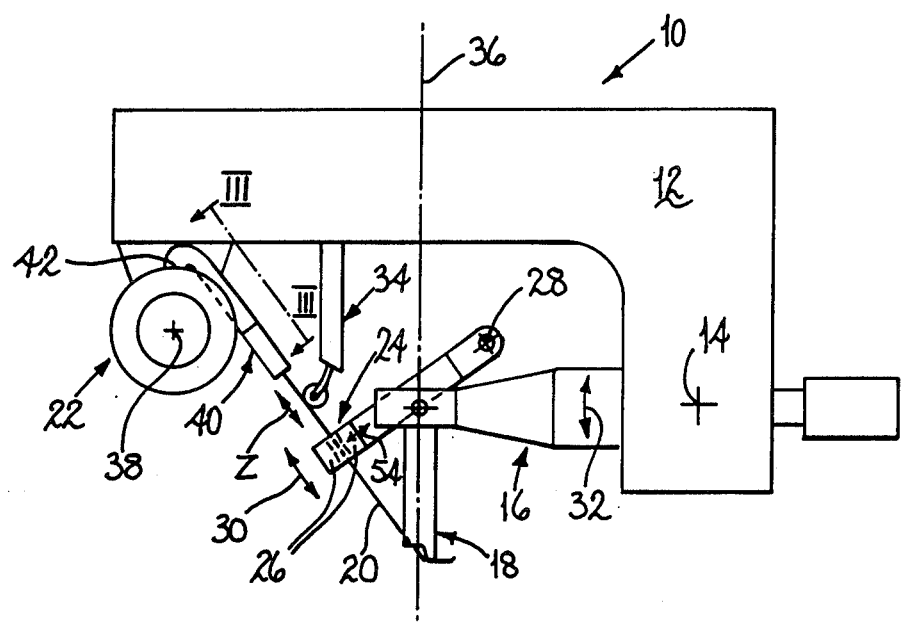
FIG. 6 is a diagrammatic view in side elevation of a second embodiment of a wire bonding machine, with parts broken away, showing a bonding head embodying the invention.

The bonding head 10 shown in FIG. 6 is very similar to the bonding head of FIG. 1 and comprises a frame 12, an ultrasonic transducer 16 mounted therein so as to be pivotable about an axis 14, a bonding tool or wedge 18 which is disposed on said ultrasonic transducer 16 and by means of which an electrically conductive wire 20 is urged against a bonding pad (not illustrated) of an electric or electronic component while being ultrasonically excited, a wire spool 22 from which the wire 20 is unwound, and wire clamping means 24 for locating the wire tail in its proper position after completion of each bonding operation, said wire clamping means being reciprocable in wire feed direction Z as already described above in connection with FIG. 1. However, in addition thereto it may be mentioned that both the wire clamping means 24 and the drive means therefor and the above mentioned knife 82 are mounted so as to be vibration isolated relative to the ultrasonically excitable bonding tool 18 and the transducer 16. For the rest, however, the wire clamping means 24 is preferably movable upwards and downwards together with the bonding tool 18 so as to prevent bending of the wire in the region of the wire feed side of the bonding tool 18. To supplement the above explanations, reference is made to the earlier German patent application No. P 33 43 738.6.

As will be apparent from FIG. 6, the wire spool 22 is adapted to be mounted to the bonding head 10 or its frame 12 on the side opposite the transducer 16 as viewed in relation to the bonding tool 18. The spool 22 is mounted on the bonding head 10 so as to be rotatably driven. The basic setting of the transducer 16 and/or the inclination of the bonding tool 18 relative to the transducer 16 and thus to the bonding pad of the component (not illustrated) are variable or adjustable within a large range (see above described embodiment), and that substantially independently of the wire feed. The up and down motion of the bonding tool 18 is caused by pivoting the transducer 16 about the axis 14 in the direction of the double arrow 32. Bonding tool or wedge 18, transducer 16, wire clamping means 24 and wire feed means define an approximately common plane. The pivot axis 14 extends approximately normal thereto. The same holds for the pivot axis 28 of the wire clamping means 24. In this plane there is also provided a wire tension sensor 34, which will be explained in detail below. Said sensor is effective between the wire spool 22 and the wire clamping means 24 and is used to control the rotary drive of the wire spool 22.

Figure 8:
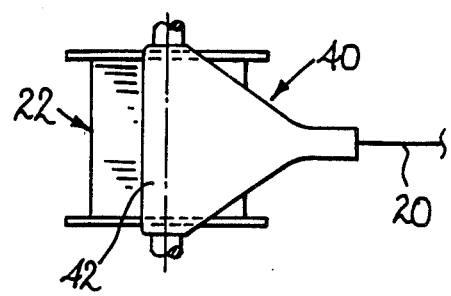
FIG. 8 is a partial view of the bonding head of FIG. 6 along the line III—III of FIG. 6, illustrating the wire feed means associated with the wire spool.

The embodiment illustrated in FIG. 6 is a rotary bonding head. The axis of rotation of the bonding head 10 is indicated at 36 in FIG. 6 (see also FIG. 1). Said axis extends approximately normal to the contact area of the component to be bonded and passes through the bonding tool 18 as already described in connection with FIG. 1. The wire spool 22, which is likewise mounted for rotation about an axis 38 extending approximately parallel to the pivot axes 14, 28, has a wire guide member in the form of a flat guide funnel 40 associated therewith, the opening 42 of said funnel which faces the wire spool 22 extending approximately across the entire width of the wire spool 22 (see FIG. 8).

Figure 7:
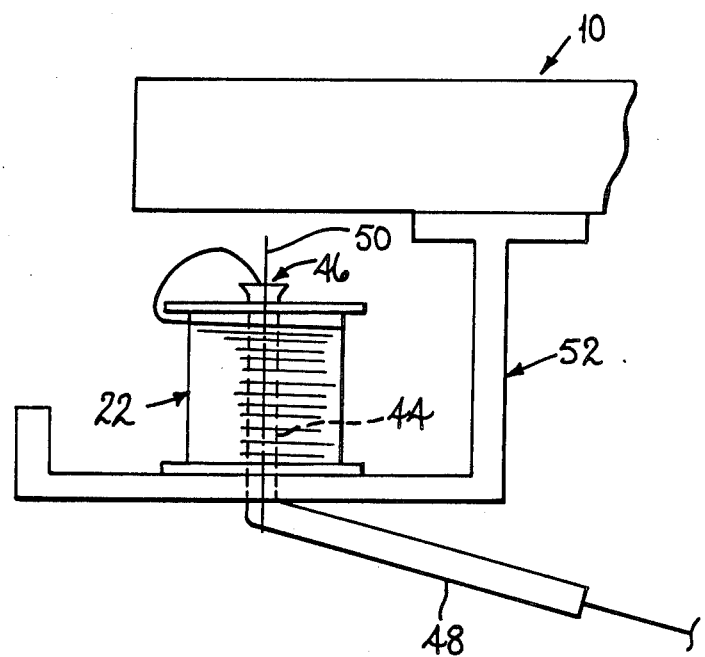
FIG. 7 is also a diagrammatic side view drawn to a larger scale and illustrating an arrangement of a wire spool at the bonding head, said arrangement being a modification of FIG. 1.

Another embodiment of a wire guide member is characterized by a narrow wire guide tube 44 centrally passing through the spool 22 and including a wire insertion funnel 46 provided on one side thereof and a wire deflecting portion joined to the opposite side and being in the form of a deflecting tube 48 directed towards the bonding tool or wedge 18 (see FIG. 7). In this embodiment the spool 22 is preferably mounted on the bonding head 10 for rotation about an axis 50 which extends approximately parallel to the rotational axis 36 of the rotary bonding head 10. To this end a separate spool receiving member (spool mounting) 52 is provided in the spool area of the bonding head 10.

In FIGS. 1 to 8 the spool drive has not been illustrated. In this respect a conventional measure is concerned which has been omitted in order to facilitate understanding of the basic principle of the invention. In FIG. 6 the reciprocating movement of the upper (in FIG. 6) clamping jaw 26 is indicated by the double arrow 54.

The bonding tip 19 of the bonding tool 18 which faces the bonding area of the component to be bonded is configured, for example, in the way described above. The adjustable guide 60 for the wire 20 is not shown in FIG. 6. This guide 60 may be added if appropriate.

We claim:

1. A bonding head, especially for ultrasonic bonding a wire (20) to a contact surface of an electronic or electrical component comprising a head support means, an ultrasonic transducer (16) secured to said head support means, a bonding tool (18) having a bonding tip and connected to said ultrasonic transducer (16), a wire supply support means for supporting a wire supply (22) from which wire (20) is unwound and a wire tail is located aligned with said bonding tool for completion of a bonding operation, said wire supply support means being mounted to a side of the head support means (12) opposite from the transducer (16), a wire guide means including a guide having an inlet end through which wire (20) passes and an outlet end adjacent said bonding tip (19) of said bonding tool, a guide mounting means including said head support means (12), a depending straight arm (70) extending vertically downwardly from said head support means, a pivot member (78) pivotally mounting said guide to the lower end of said arm (70) with a first adjustment axis for right angular movement about an axis at a right angle to movement of the wire through said guide, and a pivot support member (74) connecting said arm (70) to said head support means, said pivot support member supporting the upper end of said arm, having an axis for angular movement about a second adjustment axis at the upper end of said arm parallel with said first adjustment axis and being located in upwardly spaced relationship to said pivot member (78) whereby the angle of the guide (60) can be adjusted to a fixed operating position while maintaining said outlet end (64) in position adjacent the bonding tip (19).

2. The bonding head of claim 1 including wire clamping means (24) for locating the wire tail, said clamping means being operative between the wire supply (22) and bonding tool (18) and being reciprocatingly movable in wire feeding direction (Z).

3. The bonding head of claim 2 wherein said transducer (16), said bonding tool (18), said wire clamping means (24) and said wire feeding means are disposed approximately in a common plane, and said transducer (16) and said wire clamping means (24) each include a pivotal support having a pivot axis (14 and 28, respectively) extending approximately perpendicularly to said plane.

4. The bonding head of claim 2 having a cutting means (82) for severing the wire (20), said cutting means being located on the side of said bonding tool (18) opposite the wire feeding side and at a slight distance from said tool, whereby said wire (20) after each bonding operation is withdrawn by said wire clamping means (24) at least to such an extent that its tail is approximately flush with the side of the bonding tool (18) opposite the wire feeding side.

5. The bonding head of claim 2 wherein said wire clamping means (24) includes an adjustable support to adjust the clamping path for said wire.

6. The bonding head of claim 1 wherein said wire supply support means includes a rotatable means and a wire spool is rotatably mounted on said support means and includes the wire supply.

7. The bonding head of claim 1 including a wire tension sensor (34) located to monitor the wire and controlling the movement of the wire.

8. The bonding head of claim 1 wherein said wire supply support means includes a guide funnel (40) through which the wire moves from said wire supply (22), said funnel having a mouth (42) facing the wire supply (22) and extending approximately across the entrie width of said wire supply (22).

9. The bonding head of claim 1 wherein said wire supply support means includes a rotating spool (22), and having a wire guide tube (44) centrally extending through said spool (22), said guide tube (44) including a wire insertion funnel (46) on one side thereof and a wire deflecting portion (48) extending from the opposite side directed towards said bonding tool (18) and at an angle to the centrally extending portion of the guide tube.

10. The bonding head of claim 1 including an auxilliary guide (56) mounted intermediate the supply support means and the wire clamp (24) and adjustable transversely of the feed direction (Z) of the wire (20) whereby to align the wire (20) fed from the supply (22) with the inlet end of the guide (60).

11. The bonding head of claim 1, wherein said transducer (16) includes an adjustable mounting means for adjusting the position relative to the component to be bonded.

12. The bonding head of claim 1 wherein said bonding tool has a flat bonding wall extended in the direction of the wire, said bonding wall having a centrally located semi-circular recess for receiving the wire.

13. A bonding head, especially for ultrasonic bonding a wire (20) to a contact surface of an electronic or electrical component comprising a head support means, an ultrasonic transducer (16) secured to said head support means, a bonding tool (18) having a bonding tip and connected to said ultrasonic transducer, (16), a wire supply support means for supporting a wire supply from which wire (20) is unwound and the wire tail is located aligned with said bonding tool for completion of a bonding operation, said wire supply support means being mounted to a side of the bonding head support means (12) opposite from the transducer (16), a wire guide means including a guide having an inlet end through which wire (20) passes and an outlet end adjacent said bonding tip (19) of said bonding tool, a guide mounting means including a depending arm, a pivot means pivotally mounting said guide to said arm with a first adjustment axis for right angular movement about an axis at a right angle to movement of the wire through said guide, a pivot support for said arm (70) having an axis for angular movement about a second adjustment axis parallel with said first adjustment axis whereby the angle of the guide (60) can be adjusted to a fixed operating position while maintaining said outlet end (64) in position adjacent the bonding tip (19) and wherein said wire guide is a tubular member having a passage (66) with a diameter substantially greater than the wire and an outlet end portion (64) having a passage (68) with a diameter slightly greater than the wire.

* * * * *